United States Patent

[11] 3,634,150

[72] Inventor Fordyce H. Horn, deceased late of Schenectady County, N.Y. by Helen W. Horn, executrix

[21] Appl. No. 836,671

[22] Filed June 25, 1969

[45] Patented Jan. 11, 1972

[73] Assignee General Electric Company

[54] METHOD FOR FORMING EPITAXIAL CRYSTALS OR WAFERS IN SELECTED REGIONS OF SUBSTRATES

1 Claim, 9 Drawing Figs.

[52] U.S. Cl. .......... 148/175, 148/1.6

[51] Int. Cl. .......... H01l 7/36

[50] Field of Search .......... 148/175

[56] References Cited

UNITED STATES PATENTS

| | | | |
|---|---|---|---|
| 3,133,336 | 5/1964 | Marinace | 148/175 |
| 3,296,040 | 1/1967 | Wigton | 148/175 |
| 3,306,788 | 2/1967 | Sterling et al. | 148/175 |
| 3,316,130 | 4/1967 | Dash et al. | 148/175 |
| 3,421,055 | 1/1969 | Bean et al. | 148/175 |

*Primary Examiner*—Delbert E. Gantz

*Assistant Examiner*—G. J. Crasanakis

*Attorneys*—John F. Ahern, Paul A. Frank, Jerome C. Squillaro, Frank L. Neuhauser, Oscar B. Waddell and Joseph B. Forman

ABSTRACT: A method for growing semiconductor material on insulating or conducting substrates or in small apertures in insulating or conducting substrates is disclosed. The method comprises masking the surface of a nucleating semiconductor substrate with an appropriately apertured mask, epitaxially growing semiconductor material through the apertures and separating the mask with its grown semiconductor material from the nucleating substrate to produce either discrete crystals in a substrate or a crystal wafer on a substrate.

Inventor:
Fordyce H. Horn, Deceased.
by Jerome C. Squillaro
His Attorney.

Inventor:
Fordyce H. Horn, Deceased.
by Jerome C. Squillaro
His Attorney.

METHOD FOR FORMING EPITAXIAL CRYSTALS OR WAFERS IN SELECTED REGIONS OF SUBSTRATES

The present invention relates to the improvements in semiconductor technology and more particularly to a method for producing material by epitaxial deposition with an iodine transport process.

The growth of single or polycrystalline semiconductor material such as silicon or germanium over the surface of a semiconductor substrate by the epitaxial process is well known in the art. In fact, it is known that epitaxially grown silicon may be doped to desired resistivity levels with either an N- or P-type impurity so as to produce semiconductor devices with various arrangements of PN-junctions In general, the epitaxial growth or layer is achieved by hydrogen reduction of silicon tetrachloride; however, a more desirable method for producing epitaxial layers is described in a copending Pat. application, Ser. No. 636,911, filed May 8, 1967, and entitled, "Epitaxial Deposition of Silicon by Iodine Transport," by Ernest A. Taft, Jr., of common assignee and incorporated herein by reference. This latter process, it has been found, is particularly useful because it has the unique ability to cause iodine transport epitaxy to seek and fill small holes in masks overlaying a semiconductor substrate which may be used to propagate the growth of crystal wafers, discrete crystal devices on insulating substrates or discrete crystal devices in selected regions of insulating substrates.

It is the purpose of the present invention to describe a process for growing discrete crystals of semiconductor material, such as silicon, by the aforementioned iodine transport process wherein discrete crystal growth is propagated through a multiplicity of small holes in a relatively thick wafer or mask which may have insulating or conducting properties and which is initially in contact with a substrate used to nucleate the desired crystal growth. Since the nucleating sites are very small and have a small mechanical strength, after the desired thickness of semiconductor material is grown, the mask, with its newly grown crystals, is separated from the substrate, thereby providing discrete crystals in an insulating or conducting mask. Alternately, a layer of crystal can be grown over the surface of the mask by continuing the growth above the holes. Additionally, the mask may be provided with recesses having holes at the bottoms thereof in which semiconductor material is deposited by the iodine transport process, thereby achieving isolated regions of discrete crystal.

It is accordingly, an object of this invention to provide a method for propagating discrete crystal devices through insulating or conducting masks in contact with a nucleating substrate.

It is a further object of the present invention to provide a method for propagating discrete crystal silicon wafers on substrates with electrically insulating properties.

It is still a further object of the present invention to provide a method for making discrete crystal devices in selected regions of insulating or conducting substrates.

Briefly, in accord with one embodiment of the invention, the propagation of discrete crystal structure is achieved by oxidizing or otherwise masking the surface of a nucleating crystal substrate, forming very small holes in an appropriately spaced array through the mask and then filling the holes by the iodine transport epitaxy process thereby propagating discrete crystal growth in each of the holes. The crystal orientation of the newly grown crystal is entirely controlled by the nucleating crystal structure beneath the mask. In accord with another embodiment of the invention, a thin mask is provided with small holes appropriately spaced and in intimate contact with a nucleating crystal substrate of silicon which is subjected to the iodine transport epitaxy process such that the holes are filled and the epitaxy process allowed to proceed until a single crystal wafer of desired thickness is formed over the entire surface of the insulating mask. The mask and epitaxially deposited crystal wafer may then be separated from the substrate crystal by cleaving, for example. In accord with still another embodiment of the invention, the mask may be provided with recesses having holes in the bottom thereof so that epitaxial growth by the iodine transport process fills the holes and recesses with silicon nucleated by the seed from the crystal below the mask.

Although the invention is described herein as applied to the epitaxial growth of silicon by the iodine transport process, it is within the contemplation of the present invention that other monatomic semiconductor materials such as germanium, or compound semiconductor materials such as indium antimonide, gallium-arsenide, or the like, may be epitaxially grown in selected patterns in accordance with the teachings herein.

The novel features believed characteristic of the invention are set forth in the appended claims. The invention itself, together with objects and advantages thereof may best be understood by reference to the following description taken in connection with the appended drawing wherein:

Figure 1:
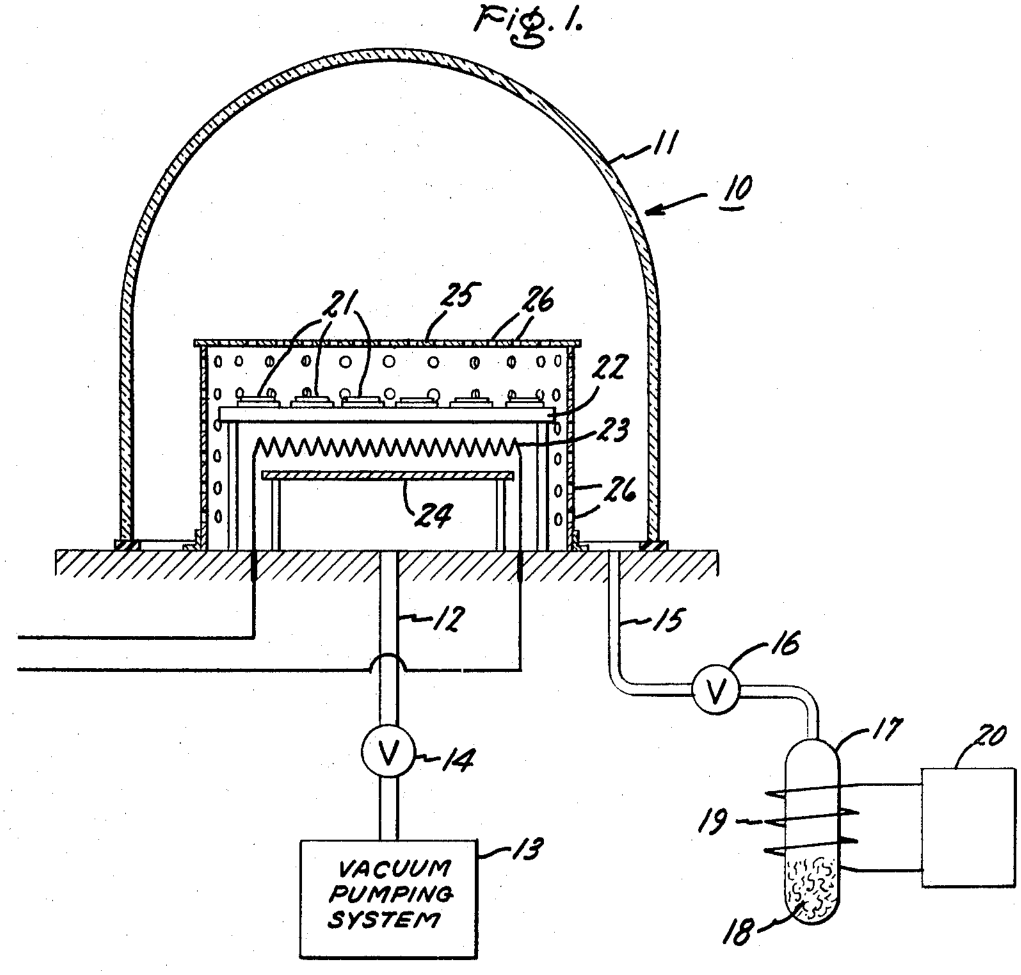
FIG. 1 is a sectional view of one form of apparatus useful in practicing the method of the present invention.

Referring to FIG. 1, an evacuable chamber 10 is provided, for example, by a reactor vessel 11 made from a heat-resistant and nonreactive material such as quartz. An exhaust pipe 12 connects the reactor to the vacuum pumping system 13 through an exhaust valve 14. An iodine vapor supply pipe 15 connects the reactor vessel 11 through an iodine supply valve 16 to a chamber 17 providing a source of iodine vapor. The iodine vapor source comprises iodine crystals 18 which may be caused to sublime by appropriate heating means such as a heating tape 19 wrapped around the iodine chamber 17 and energized through a temperature controller 20. Semiconductor bodies 21 placed within a reactor are supported by a plate 22 of nonreactive materials such as quartz. Beneath the support plate 22 is an electric resistance heater 23 for controlling the temperature within the reactor. Heat shields 24 and 25, made of sheet tantalum or the like, have apertures 26 therein arranged in spaced surrounding relation with the heater 23 and support plate 22.

Figure 2:
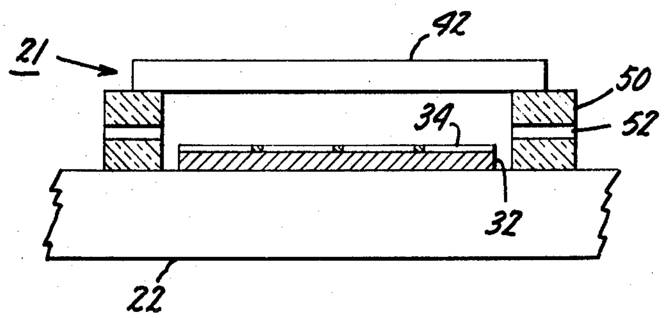
FIG. 2 is an enlarged fragmentary sectional view of a portion of the structure shown in FIG. 1.

In FIG. 2 there is illustrated an enlarged view of the semiconductor body 21 comprising a member 32 which may for example be monocrystalline semiconductor material and which is intended to serve as a nucleating substrate for epitaxial growth according to the invention. The substrate 32 with an apertured mask 34 in contact therewith is placed in the reactor 11 on the support plate 22 in confronting parallel relation with a source body 42 of silicon. The source body 42 comprises semiconductor material which need not be monocrystalline, but which has the desired impurity concentration for the layer to be epitaxially deposited on the substrate 32. The spacing of the source 42 from the substrate 32 is preferably, for example, 4 to 80 mils (i.e., 0.004 to 0.080 inch), and this spacing may be effected by a separating ring 50 of quartz or other nonreactive material capable of withstanding the temperatures involved. The ring or spacer rests on support plate 22 in surrounding relation with substrate 32 and may be notched at its edges or otherwise provided with a plurality of small openings, such as shown at 52, to allow entrance of a sufficient amount of iodine vapor into the space between the substrate 32 and the source 42 while minimizing turbulence of such admitted vapor.

Figure 3:
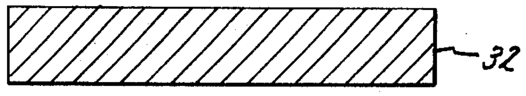
FIGS. 3 through 9 are sectional views of portions of the semiconductor body during successive steps in the fabrication of devices according to the invention, the scale being enlarged for clarity.
Figure 4:
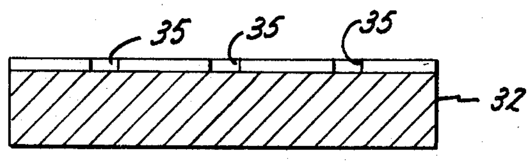

Referring now to FIG. 3, there is illustrated the substrate body 32 which may, for example, comprise a homogeneous monocrystalline body of semiconductor material such as silicon having a uniform predetermined content of conductivity-type-determining impurity throughout. As illustrated in FIG. 4, on at least one surface which is to serve as the epitaxial growth surface, substrate 32 is covered with a mask 34 of masking material, such as ceramic, glass, quartz, sapphire, semiconductor material, metals or oxides of metals such as molybdenum, tantalum, tungsten or other refractory metals, oxides of silicon, silicon nitride, silicon carbide, or molybdenum coated with silicon nitride, to mention only a few. The thickness of the masking layer 34 is not critical, but may for purposes of illustration only, be in the range of 5,000 angstroms to 50 mils. Apertures 35 are made in selected portions of the masking layer 34, as shown in FIG. 4, by any suitable technique such as, the photolithographic etching process or other well-known processes in the art. The apertures 35 may be circular or rectangular and have radii or side dimensions ranging from the micron region to 10 mils or larger if desired. The resultant selectively apertures layer 34 forms a mask whose openings expose selected portions of the underlying substrate body 32 with sharply defined predetermined boundaries. One or more bodies 21 thus prepared are then placed in the reactor 11 as illustrated in FIG. 1.

The reactor 11 is then purged with a purging gas such as argon, and evacuated to a pressure of about $10^{-5}$ mm. of mercury by the vacuum pumping system 13. Heater element 23 is then energized and a substrate is heated to a temperature in the range of 800° C. to 1,400° C. The source body 42 is preferably maintained about 100° C. below the substrate temperature, the temperature differential being obtained for example, by appropriately positioning the shields 25.

The epitaxial growth is begun by admitting iodine vapor into the reactor 11. The iodine vapor pressure is maintained in the range of 3 to 100 mm. of Hg. Without limiting the process of this invention to a particular theory of operation, it is believed that the iodine vapor contacts the lower temperature source 42 and combines with the molecules to form one or more iodides of silicon. The resultant component diffuses quickly to the adjacent surface of the substrate 32, whereupon the higher temperature of the substrate decomposes the iodide and releases the iodine so that it returns to the source to take part in further transportation. At the time of decomposition of the iodide, semiconductor material from the source 42 is deposited on the exposed surfaces of the substrate 32, as shown at 36 in FIG. 5. The transportation of the semiconductor material from the source 42 to the substrate 32 causes a uniform removal of semiconductor material from the surface of the source 42. Accordingly, the impurity concentration of the source will be transferred with high precision to the layer 36 epitaxially deposited on the substrate 32. Additionally, the enclosed nature of the body 21 exhibits minimum turbulence between the source 42 and the substrate 32, thereby enabling the epitaxial deposit to take place with a high degree of uniformity in both thickness and resistivity across the selected surface portions of the substrate.

In accord with the above-described transport process, epitaxial deposition or growth of source material onto the substrate occurs at growth rates of 2 to 10 microns of thickness per minute. The epitaxially deposited material 36 forms a continuation of the original substrate crystal lattice structure but only in those areas 36 which expose the substrate to the transport process. For example, if the substrate material is of monocrystalline configuration, the epitaxially deposited material 36 will also be of a monocrystalline configuration.

Figure 5:
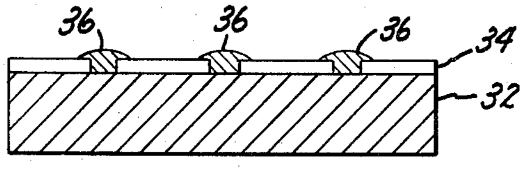
Figure 6:
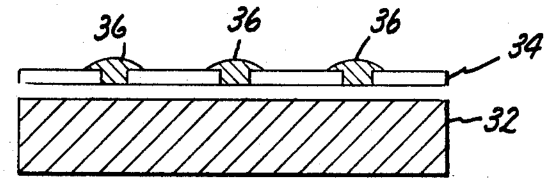

As illustrated in an exaggerated manner in FIG. 5, as the epitaxial growth extends beyond the boundaries of the masking material 34, the crystal growth tends to be in a horizontal plane along the surface of the masking layer 34. If, as illustrated in FIG. 5, it is desired to create single crystal structures, then when the thickness of the epitaxial layer 36 attains the desired dimension, the iodine transport process may be stopped. The bodies 21 are then removed from the reactor and in the event that the masking layer 34 is an oxide, it may be etched away and the epitaxially grown crystals separated from the substrate wafer. In the event that the masking material 34 is ceramic, quartz, metal, or another material in which it would be desirable to retain each of the crystal wafers, the entire masking layer 34 can be separated from the substrate 32 by cleaving, for example. This is readily accomplished since the apertures 35 are very small and exhibit a small mechanical strength when compared with the total surface area covered by the mask 34. Accordingly, the mask 34 can be readily cleaved from the substrate 32 with the semiconductor wafers 36 remaining intact after cleaving. This condition is illustrated in FIG. 6. The masking material 34 with its semiconductor wafers 36 may then be used in the fabrication of diodes, transistors, integrated circuits, optical readers and various other applications.

Figure 7:
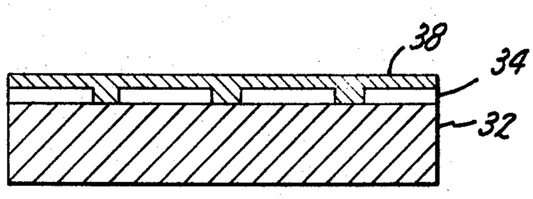

After cleaning and repolishing, the substrate 32 can be used again. This feature is particularly desirable, not only because it reduces costs of manufacture but also because it enables the manufacture of many crystal wafers with the exact same crystal structure. As described previously, once the epitaxial growth has extended beyond the thickness of the masking layer 34, the growth of the semiconductor material is along a plane parallel to the surface of the masking layer. Accordingly, by continuing the epitaxial growth, it is possible to grow a semiconductor wafer of desired thickness over the entire surface of the masking layer 34. This is illustrated in FIG. 7. Since the iodine transport process provides uniform growth from each nucleating site, and the orientation of the crystal structure is determined by the substrate semiconductor material 32, the overgrowth 38 quickly aligns itself so that it is of the uniform thickness and crystal orientation.

Figure 8:
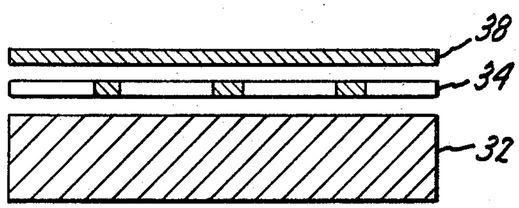

As illustrated in FIG. 8, the overgrowth 38 and masking layer 34 may be cleaved or otherwise separated from the substrate 32 so as to provide a semiconductor wafer of uniform thickness and crystal orientation which may be used in the fabrication of other semiconductor devices.

Figure 9:
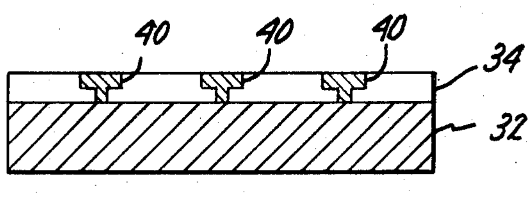

Another embodiment of the invention is illustrated in FIG. 9 wherein a masking material 34 with recesses 40 is provided with small holes formed in the base of each recess so as to provide a nucleating site for crystal growth from the semiconductor substrate 32. The recesses 40 may have any desired depth or configuration depending upon the requirements of the particular application. For example, it may be desirable to provide circular recesses if a semiconductor wafer grown therein is to be ultimately used as a diode structure. Obviously, other configurations such as squares, rectangles, or strips could be fabricated to mention only a few. As described previously, the masking layer 34 may be cleaved from the substrate 32 and used in the fabrication of various semiconductor devices.

EXAMPLE 1

The device shown in FIG. 6 may be constructed in accord with the teachings of the instant invention as follows. Utilizing apparatus such as illustrated in FIG. 1, a substrate wafer 32 of substantially undoped monocrystalline silicon, for example, is selected to have a diameter of approximately 1 inch and a thickness of 7 mils. A masking layer 34 such as quartz, molybdenum, tantalum, tungsten or any of the other refractory materials capable of withstanding the temperatures involved and having the desired number of apertures therein, is placed over the substrate 32 as illustrated in FIG. 4. The masking layer 34 may have a thickness of approximately 0.5 milli-inch and approximately 2,000 5-mil diameter circular apertures formed in the mask. The substrate with its mask is placed on the support plate 22 of the reactor 11, as shown in FIGS. 1 and 2. A source wafer 42 of approximately 1 inch in diameter and several hundred mils thick, P-doped with boron to a resistivity of 5 ohm-centimeters is placed on the support ring 50 in spaced confronting relation with the substrate wafer 32. The reactor is then purged with argon for approximately 5 minutes, evacuated to a pressure of $10^{-5}$ millimeters of mercury, and sealed from the vacuum pumping system 13 by the valve 14. The heater 23 is then energized and the substrate wafer brought to a temperature of 1,050° C. Heater element 19 is then energized to bring the iodine source 18 to a temperature of about 55° C., whereupon iodine vapor is admitted to the reactor 11 until the iodine vapor pressure in the reactor is 3 millimeters of mercury. Iodine transport of silicon from the source 42 to the substrate 32 then takes place, and after 15 minutes, the transfer is stopped by turning off the heater 23, closing the iodine supply valve 16, and purging the reactor with argon. An epitaxial structure 36 about 3 mils thick is found to have grown on each selected area of the substrate wafer exposed through the masking layer 34. Each structure thus produced has a crystal orientation similar to that of the substrate 32. As illustrated in FIG. 6, the masking layer 34 is removed from the substrate layer 32 so as to provide an array of crystal structures in the masking layer 34.

By known techniques forming no part of this invention, the masking layer 34 with its semiconductor wafers 36 may then be processed to form semiconductor devices.

EXAMPLE 2

FIG. 7 illustrates the condition wherein the process described above with reference to example 1 is utilized, however, the masking layer 34 is made of either a metal or an oxide of molybdenum having a half-mil thickness with 3-micron diameter holes spaced on 10-micron centers. In this instance, the epitaxy process is allowed to proceed until an overgrowth 38 of the desired thickness is obtained. For example, by allowing the process to proceed for 15 minutes, an overgrowth of approximately 3-mils thickness is found to have grown over the masking layer 34. The crystal orientation of the overgrowth 38 is the same as that of the substrate crystal 32. The masking layer 34 may then be separated from the substrate layer 32 and the masking layer cleaved from the overgrowth 38, so as to provide a wafer of 3-mil thickness for use in the fabrication of semiconductor devices. This condition is illustrated in FIG. 8.

EXAMPLE 3

To illustrate the versatility of the procedure of the instant invention, apparatus such as that illustrated in FIG. 1 may be used to fabricate crystal structures similar to those illustrated in FIG. 9. For example, a substantially undoped monocrystalline silicon substrate of 1-inch diameter and 7-mils thickness is selected as the nucleating substrate 32. The substrate may be covered with a masking layer of 2-mil molybdenum coated with silicon nitride and have an array of recesses therein with small holes formed in the base of each recess as illustrated in FIG. 9. The size and density of the recesses and holes are determined by the ultimate application of the grown structures. The substrate with its mask is placed on the support plate 22 and a silicon source wafer 42 of approximately 1 inch in diameter and several hundred mils thick, N-doped with phosphorus to a resistivity of about 3 ohm-centimeters and a major axis perpendicular to the 111 plane as defined by the Miller indices is placed on support ring 50 in confronting relation with the substrate wafer 32. The aforementioned epitaxy process is then allowed to proceed for approximately 5 minutes. A 1-mil thickness of N-doped silicon structure is found to have grown in each of the holes. The N-doped source wafer 42 is then removed and replaced with a silicon source wafer, P-doped with boron to a resistivity of 5 ohm-centimeters. The epitaxy process is then allowed to proceed again for another 5 minutes whereupon a 1-mil thickness of P-doped silicon structure is found to have grown in the recesses, thereby producing an array PN-junctions. The substrate layer 32 may then be removed, for example, by lapping, cutting or grinding, thereby producing an array of diodes in an insulating mask which may be used in microcircuitry for displays or information storage. Alternately, the array of diodes may be applied to a conducting substrate and used as optical read and display devices. To avoid the need for a separate conducting substrate, the original nucleating substrate 32 may be doped to degeneracy to provide a high-conductivity substrate interconnecting each of the diodes.

In summary, the unique ability of the iodine transport epitaxy process to seek and fill small holes in masking layers which are adjacent a semiconductor substrate, makes possible the propagation of crystal semiconductor wafers, crystal wafers on insulating substrates and crystal wafers in selected regions of an insulating substrate. From the foregoing description, it is readily apparent that the instant invention has a variety of applications, including the fabrication of semiconductor wafers for diodes, transistors, microelectronic circuitry, optical readers, display systems and information storage devices, to mention only a few.

While the invention has been set forth herein with respect to certain particular embodiments and examples, many modifications and changes will readily occur to those skilled in the art.

What I claim as new and desire to secure by Letters Patent of the United States is:

1. A method for epitaxially growing discrete semiconductor crystals from a nucleating semiconductor substrate comprising the steps of:

selecting a monocrystalline semiconductor substrate material having a uniform predetermined content of conductivity-type-determining impurities therein;

providing a masking layer having a thickness between 5,000 Angstroms and 50 mils over one major surface of said semiconductor substrate material;

forming apertures in selected regions of said masking layer to expose selected portions of the underlying semiconductor substrate material;

positioning the masked semiconductor substrate material in confronting parallel relation with a source of semiconductor material in a vacuum chamber;

heating said source of semiconductor material and said masked semiconductor substrate material to a temperature in the range of 800° C. to 1,400° C., said masked semiconductor substrate material being heated to a temperature of approximately 100° C. above said source of semiconductor material;

introducing iodine vapor into said chamber to cause formation of iodides of said source material which iodides move to the exposed portions of said semiconductor substrate material and are decomposed by the higher temperature thereof and become epitaxially deposited on the exposed portions of said semiconductor substrate material, said epitaxially deposited semiconductor material forming discrete crystals of a monocrystalline structure similar to said semiconductor substrate material;

continuing said epitaxial deposition until the thickness of said crystals is slightly greater than that of said masking layer, causing said epitaxial deposition on said crystals to extend laterally beyond said apertures; and removing said masking layer with said epitaxially grown discrete crystals of semiconductor material from said semiconductor substrate material, thereby providing discrete crystals of semiconductor material in said masking layer.

* * * * *